(12) United States Patent
Xiang et al.

(10) Patent No.: US 10,280,956 B2
(45) Date of Patent: May 7, 2019

(54) CLAMPING DEVICE FOR CONTINUOUS ADJUSTMENT OF A DISPLAY STAND

(71) Applicant: Loctek Inc., Fremont, CA (US)

(72) Inventors: Lehong Xiang, Ningbo (CN); Tao Lin, Ningbo (CN); Linghui Jiang, Ningbo (CN)

(73) Assignee: Loctek Inc., Fremont, CA (US)

( * ) Notice: Subject to any disclaimer, the term of this patent is extended or adjusted under 35 U.S.C. 154(b) by 12 days.

(21) Appl. No.: 15/695,010

(22) Filed: Sep. 5, 2017

(65) Prior Publication Data

US 2018/0045231 A1     Feb. 15, 2018

Related U.S. Application Data

(63) Continuation of application No. PCT/CN2017/092357, filed on Jul. 10, 2017.

(30) Foreign Application Priority Data

Aug. 15, 2016  (CN) .......................... 2016 1 0664478

(51) Int. Cl.
| | |
|---|---|
| *F16B 2/12* | (2006.01) |
| *F16M 13/02* | (2006.01) |
| *H05K 5/02* | (2006.01) |
| *F16B 2/06* | (2006.01) |
| *G06F 1/16* | (2006.01) |

(52) U.S. Cl.
CPC ............... *F16B 2/12* (2013.01); *F16B 2/065* (2013.01); *F16M 13/022* (2013.01); *H05K 5/0234* (2013.01); *G06F 1/1626* (2013.01); *G06F 1/1633* (2013.01)

(58) Field of Classification Search
CPC .......... H05K 5/0204; F16B 2/12; F16B 2/065
USPC ...... 248/231.71, 689, 229.12, 229.22, 228.3, 248/231.41
See application file for complete search history.

(56) References Cited

U.S. PATENT DOCUMENTS

| | | | | |
|---|---|---|---|---|
| 2,935,118 | A * | 5/1960 | Meilleur ................... | A47C 7/42 108/6 |
| 4,709,891 | A * | 12/1987 | Barnett ..................... | G09F 7/18 248/214 |
| 5,370,570 | A * | 12/1994 | Harris .................. | A63H 33/006 24/486 |
| 5,975,472 | A * | 11/1999 | Hung ................... | F16M 11/105 248/278.1 |
| 6,299,117 | B1 * | 10/2001 | Lin ....................... | F16M 13/022 24/135 R |
| 6,769,657 | B1 * | 8/2004 | Huang .................. | F16M 11/10 248/278.1 |
| 7,195,215 | B2 * | 3/2007 | Lin ..................... | F16M 11/2014 248/125.9 |

(Continued)

*Primary Examiner* — Bradley Duckworth
(74) *Attorney, Agent, or Firm* — W & K IP (57) ABSTRACT

The embodiments of the present disclosure disclose a clamping device for continuous adjustment of a display stand which comprises a holder having an upper pressing board and a side board, a connector connected to the side board having at least one connecting column, and a fastening screw screwed to the connector with a gap formed between the top of the fastening screw and the bottom of the upper pressing board. The side board comprises connecting holes and channels which allow adjusting the height of the display stand without having to disassemble the connector.

7 Claims, 12 Drawing Sheets

(56) References Cited

U.S. PATENT DOCUMENTS

| | | | | |
|---|---|---|---|---|
| 8,469,323 B1* | 6/2013 | Deros | F16M 11/105 |
| | | | 248/123.11 |
| 8,794,579 B2* | 8/2014 | Sturman | F16M 11/105 |
| | | | 248/284.1 |
| 8,985,566 B2* | 3/2015 | Chuang | F16B 2/12 |
| | | | 269/3 |
| 9,473,064 B2* | 10/2016 | Schaefer | F16M 13/022 |
| 9,791,101 B1* | 10/2017 | Frankel | F16M 13/022 |
| 2004/0084576 A1* | 5/2004 | Khan | A47B 21/0371 |
| | | | 248/118 |
| 2013/0075564 A1* | 3/2013 | Ho | F16B 2/12 |
| | | | 248/316.4 |
| 2015/0129639 A1* | 5/2015 | Miller | B23K 37/0276 |
| | | | 228/29 |
| 2016/0273865 A1* | 9/2016 | Banes | F16M 13/02 |
| 2018/0344025 A1* | 12/2018 | Corbo | A47B 21/04 |

* cited by examiner

CLAMPING DEVICE FOR CONTINUOUS ADJUSTMENT OF A DISPLAY STAND

CROSS-REFERENCE TO RELATED APPLICATIONS

This application is a continuation of International Patent Application No. PCT/CN2017/092357 with a filing date of Jul. 10, 2017, designating the United States, now pending, and further claims priority to Chinese Patent Application No. 201610664478.3 with a filing date of Aug. 15, 2016. The content of the aforementioned applications, including any intervening amendments thereto, are incorporated herein by reference.

TECHNICAL FIELD

The present disclosure relates to the field of display stands, and in particular, to a clamping device for continuous adjustment of display stands.

BACKGROUND OF THE PRESENT INVENTION

Flat display panels and tablet PCs are widely spreading today bringing supporting display stands with them. Various types of display stands in prior arts include a wall-hanging display stand and a clamping display stand installed on a table or desk. An exemplary display stand of the latter usually comprises a clamping mechanism connected to the table or desk, a rotatable arm and a hanging board to support the display. The upper end of rotatable arm is rotatably connected to the hanging board. The lower end of rotatable arm is connected to the clamping mechanism.

The clamping mechanism of prior arts usually comprises an L-shaped support, a connector and a fastening screw. The connector is connected to a connecting hole on the support through a screw. The fastening screw is screwed to the connector with a gap between a free end of the fastening screw and the top of the support for the table or desk. The support usually comprises a plurality of connecting holes along the vertical direction. A user adjusts the gap between the fastening screw and the top of the support according to thickness of the table or desk so that the fastening screw can hold the table or desk more firmly. When installing the connector, the fastening screw would fail to hold the table or desk if the shape of a connecting hole on the support would not match. If such accidents occur, it is necessary to disassemble the connector and re-install the connector with another matching connecting hole. Efficient installation would be impossible since it is time consuming to fasten the clamping mechanism to the table or desk.

SUMMARY OF PRESENT INVENTION

The present disclosure discloses a clamping device for continuous adjustment of a display stand, comprising a holder having an upper pressing board and a side board, a connector connected to the side board having at least one connecting column, and a fastening screw screwed to the connector with a gap formed between the top of the fastening screw and the bottom of the upper pressing board. The side board comprises a plurality of connecting holes along a vertical direction to receive the connecting column. The side board comprises at least one channel to connect a first connecting hole and a second connecting hole of the plurality of connecting holes which are located on two different positions along the vertical direction of the side board. The connecting column connects the connector to the side board through the plurality of connecting holes. The connecting column comprises a limiting cap on an extruding end of the connecting column to prevent falling of the connecting column off the plurality of connecting holes. The at least one channel is configured to move the connecting column from the first connecting hole of the plurality of connecting holes to the second connecting hole of the plurality of connecting holes without separating from the side board.

In some embodiments, the connecting column is one of a connecting pin and a connecting screw comprising the limiting cap on one of the two ends thereof.

In some embodiments, the connector comprises two connecting columns arranged on two different vertical positions along the connector.

In some embodiments, the side board comprises one channel which extends in the vertical direction of the side board, the plurality of connecting holes are arranged on the same side of the channel, an interval between any two adjacent connecting holes of the plurality of connecting holes along the vertical direction of the side board is constant, and the two connecting columns are in clearance fit within two adjacent connecting holes.

In some embodiments, the side board comprises two channels which are parallel with each other and extend in the vertical direction of the side board, the plurality of connecting holes comprise at least two pairs of connecting holes arranged on different positions along the vertical direction, an interval between the connecting holes of each pair is constant, an upper connecting hole of each pair is connected to a bottom part of an upper channel of the two channels, a lower connecting hole of each pair is connected to a bottom part of a lower channel of the two channels, and the two connecting columns are in clearance fit within one pair of the at least two pairs of connecting holes.

In some embodiments, the connector comprises two protruding connecting columns arranged on the same vertical position along the connector.

In some embodiments, the side board comprises two channels which are parallel with each other and extend in the vertical direction of the side board, the plurality of connecting holes comprise at least two pairs of connecting holes arranged along the channels, an interval between the connecting holes of each pair is constant, the two connecting holes of each pair are arranged on the same side of the channels, the two connecting holes of each pair are connected to the two channels respectively and the two connecting columns are in clearance fit within one pair of the at least two pairs of connecting holes.

Embodiments of the present disclosure solve at least some problems of the prior arts by providing a clamping device for a display stand which allows efficient and continuous adjustment of the display stand. The connecting holes arranged vertically on the holder can be changed freely without having to disassemble the connector.

DESCRIPTION OF THE DRAWINGS

The present disclosure is illustrated by way of example and not limitation in the figures of the accompanying drawing, in which.

REFERENCE 1 holder, 2 connector, 3 fastening screw, 4 connecting column, 5 connecting hole, 6 channel, 7 upper pressing board, 8 side board, 9 limiting cap.

DETAILED DESCRIPTION OF PREFERRED EMBODIMENTS

Detailed description of various embodiments of the present disclosure is given hereinafter. It will be understood that, although the terms first, second, third, etc. may be used herein to describe various elements, these elements should not be limited by these terms to indicate or imply any relative importance. These terms are only used to distinguish one element from another. For example, a first element could be termed a second element without departing from the scope of the present disclosure. The terms center, upper, lower, left, right, vertical, lateral, inner, outer, etc. may indicate directions or positions as illustrated in some of the drawings. These terms are only used in order not to obscure the description, and should not be construed as an indication of particular positional relation or sequence.

Figure 1:
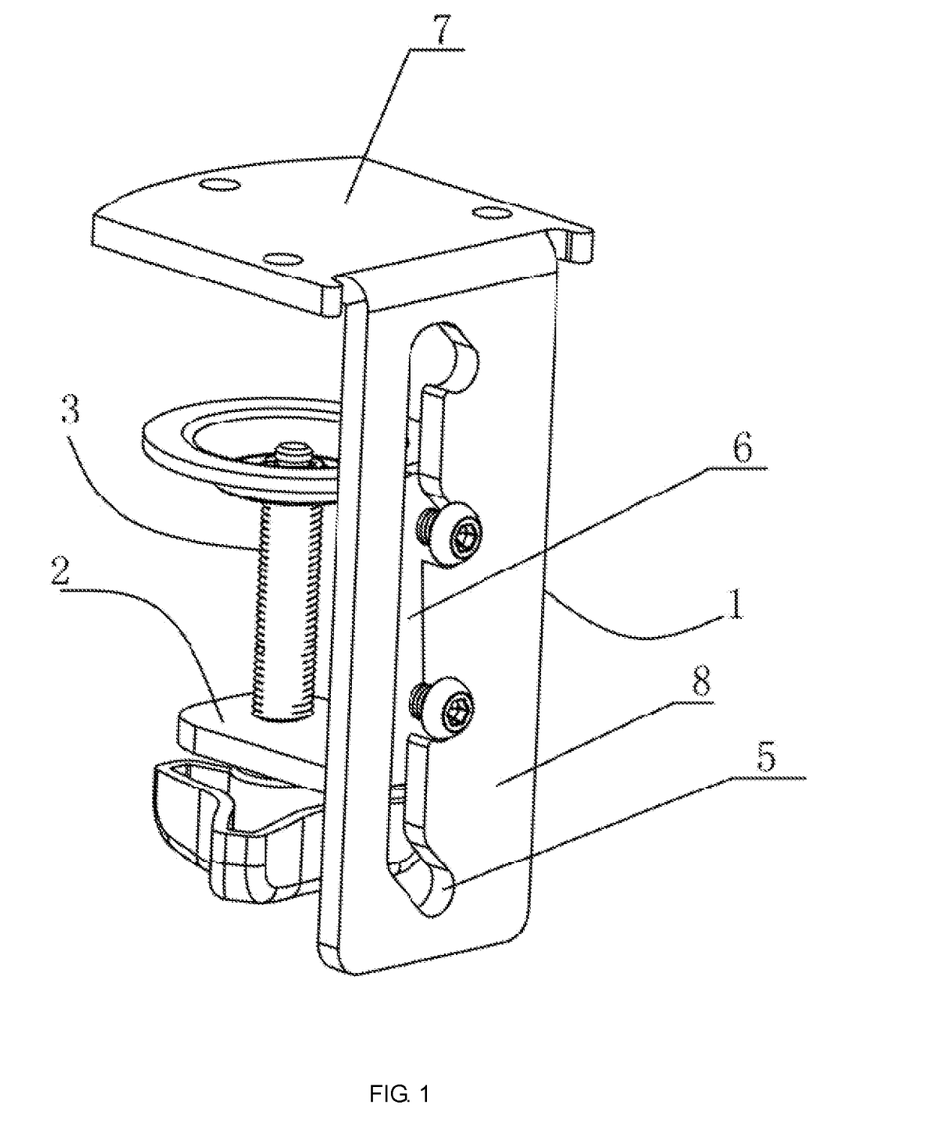
FIG. 1 illustrates the structures of a clamping device for a display stand according to a first embodiment of the present disclosure.
Figure 2:
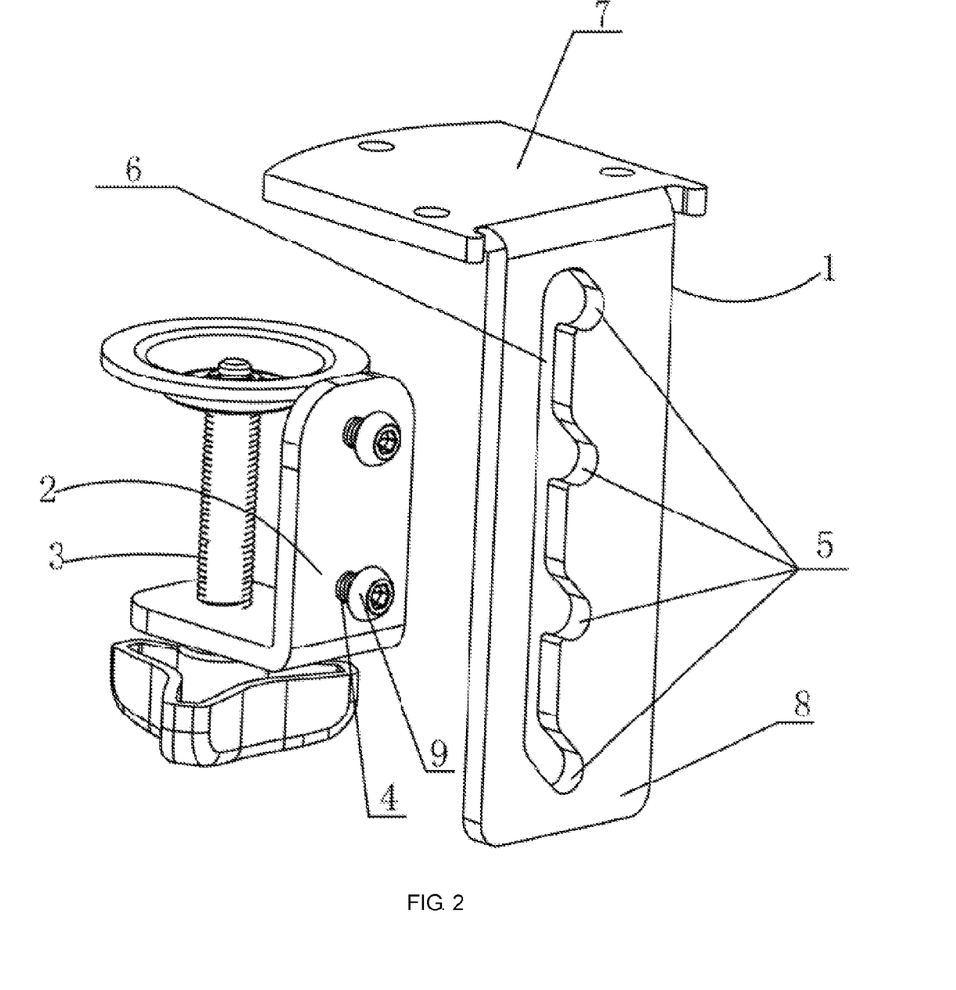
FIG. 2 illustrates the assembly of the structures of a clamping device for a display stand according to a first embodiment of the present disclosure.
Figure 3:
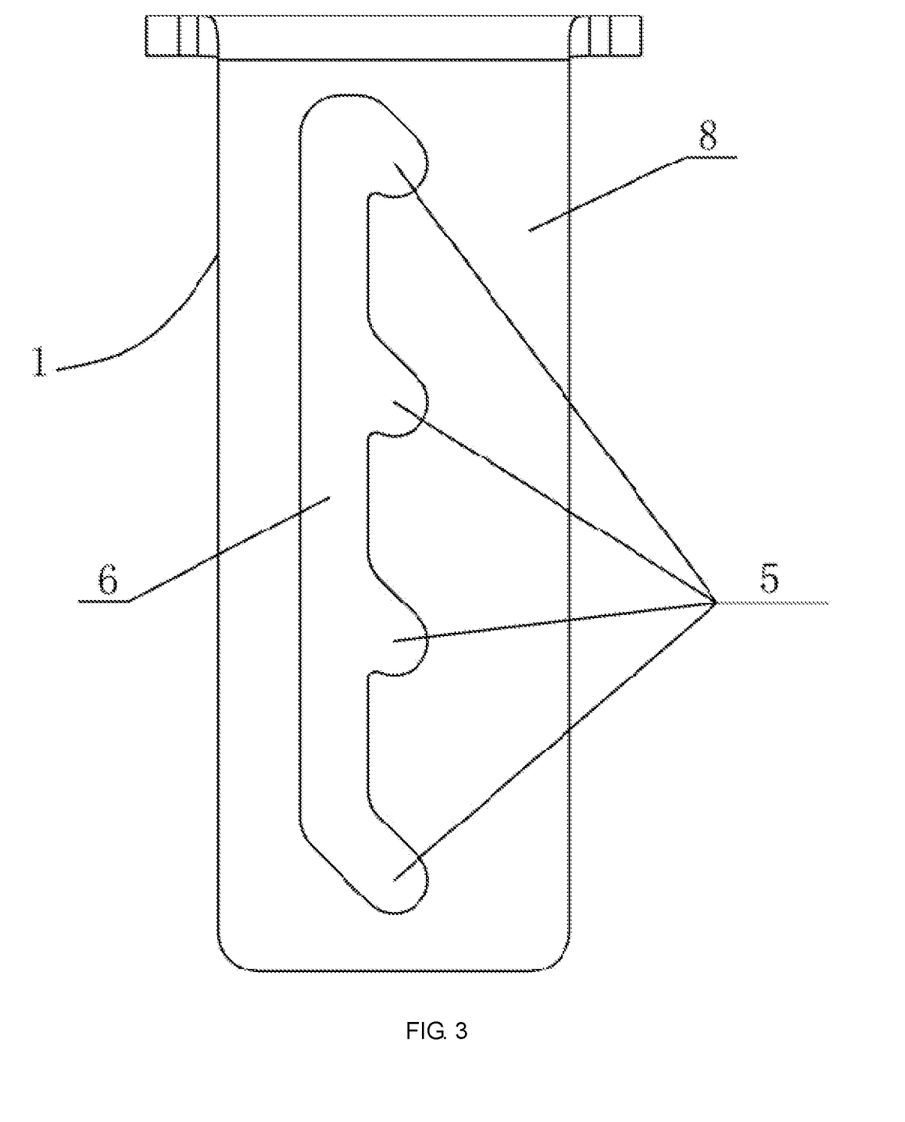
FIG. 3 illustrates the structures of a holder of a clamping device for a display stand according to a first embodiment of the present disclosure.

As shown in FIG. 1-3, a clamping device according to a first embodiment comprises a holder 1, a connector 2 and a fastening screw 3 screwed to the connector 2 to fasten to a table board. The holder 1 comprises an upper pressing board 7 and a side board 8. A gap is formed between the top of the fastening screw 3 and the bottom of the upper pressing board 7. The connector 2 is connected to the side board 8. At least one connecting column 4 is provided on the connector 2. A plurality of connecting holes 5 are provided on the side board 8 along a vertical direction to receive the at least one connecting column 4. The connecting column 4 connects the connector 2 to the side board 8 through the plurality of connecting holes 5. The connecting column 4 comprises a limiting cap 9 on an extruding end of the connecting column 4 to prevent falling of the connecting column 4 off the plurality of connecting holes 5. The side board 8 further comprises at least one channel 6 to connect at least two connecting holes 5 on different vertical positions of the side board 8. The at least one channel 6 is configured to move the connecting column 4 from a first connecting hole of the plurality of connecting holes 5 to the second connecting hole of the plurality of connecting holes 5 without separating from the side board 8. The connecting column 4 is a connecting pin or connecting screw with a limiting cap 9 on one end. For example, two connecting column 4 are connected to the connector 2. The two connecting column 4 are deployed on different vertical positions on the connector 2.

The side board 8 comprises one channel 6 extending along the vertical direction of the side board 8. The plurality of connecting holes 5 are arranged on the same side of the channel 6. The interval between any two adjacent connecting holes of the plurality of connecting holes 5 along the vertical direction of the side board 8 is constant. The two connecting columns 4 are in clearance fit within two adjacent connecting holes 5.

Figure 4:
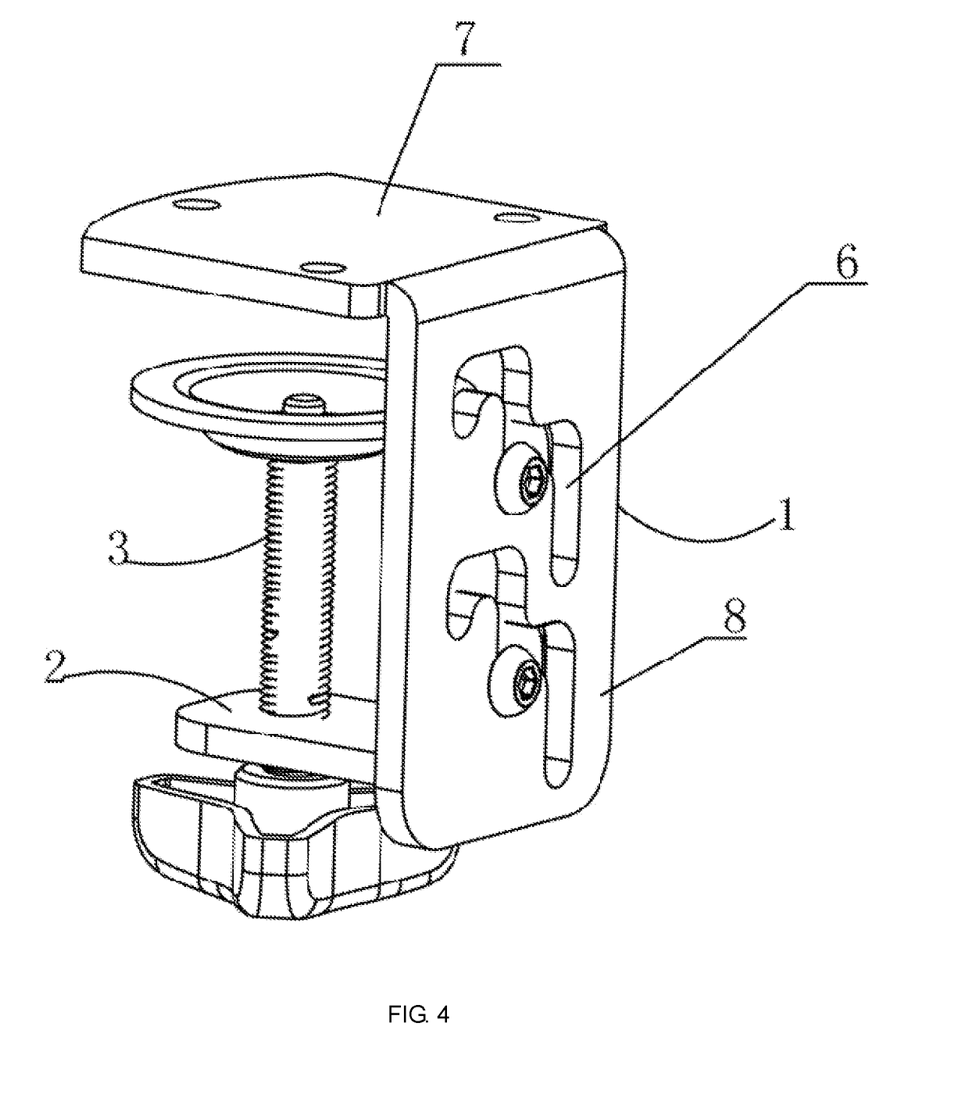
FIG. 4 illustrates the structures of a clamping device for a display stand according to a second embodiment of the present disclosure.
Figure 5:
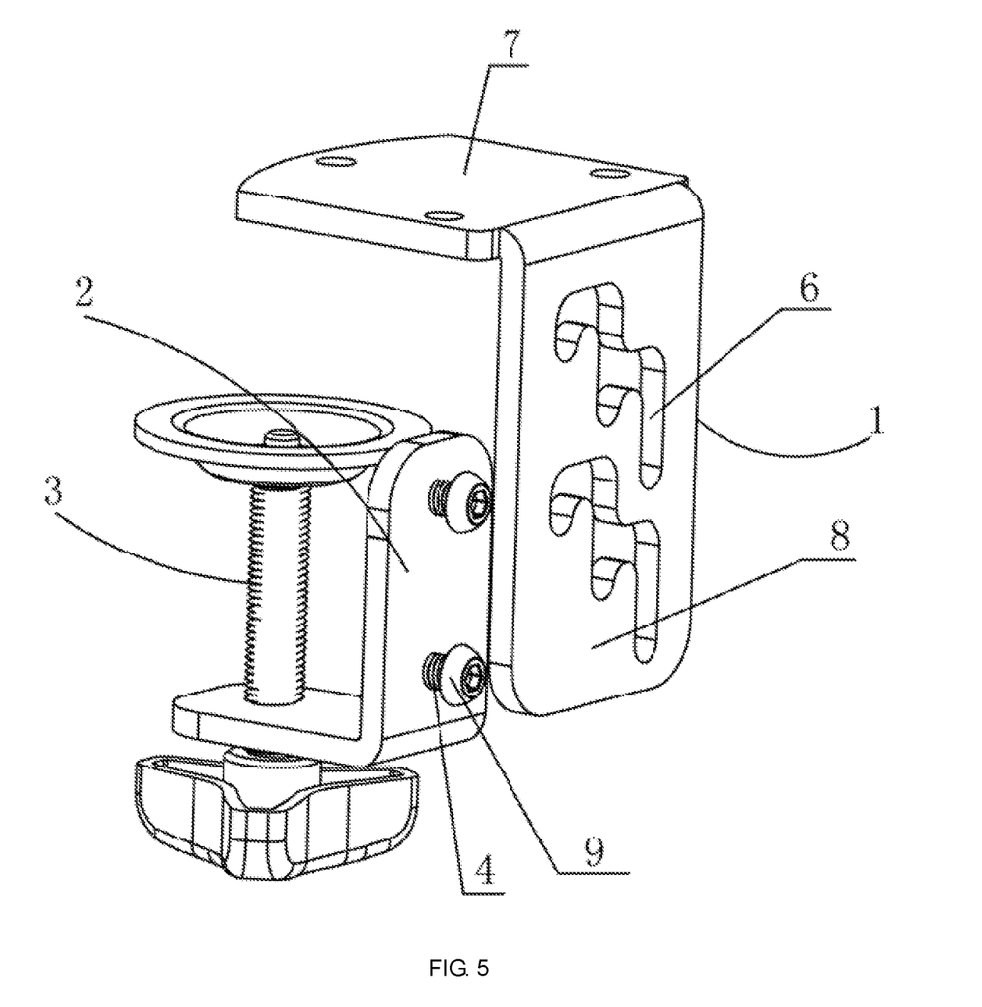
FIG. 5 illustrates the assembly of the structures of a clamping device for a display stand according to a second embodiment of the present disclosure.
Figure 6:
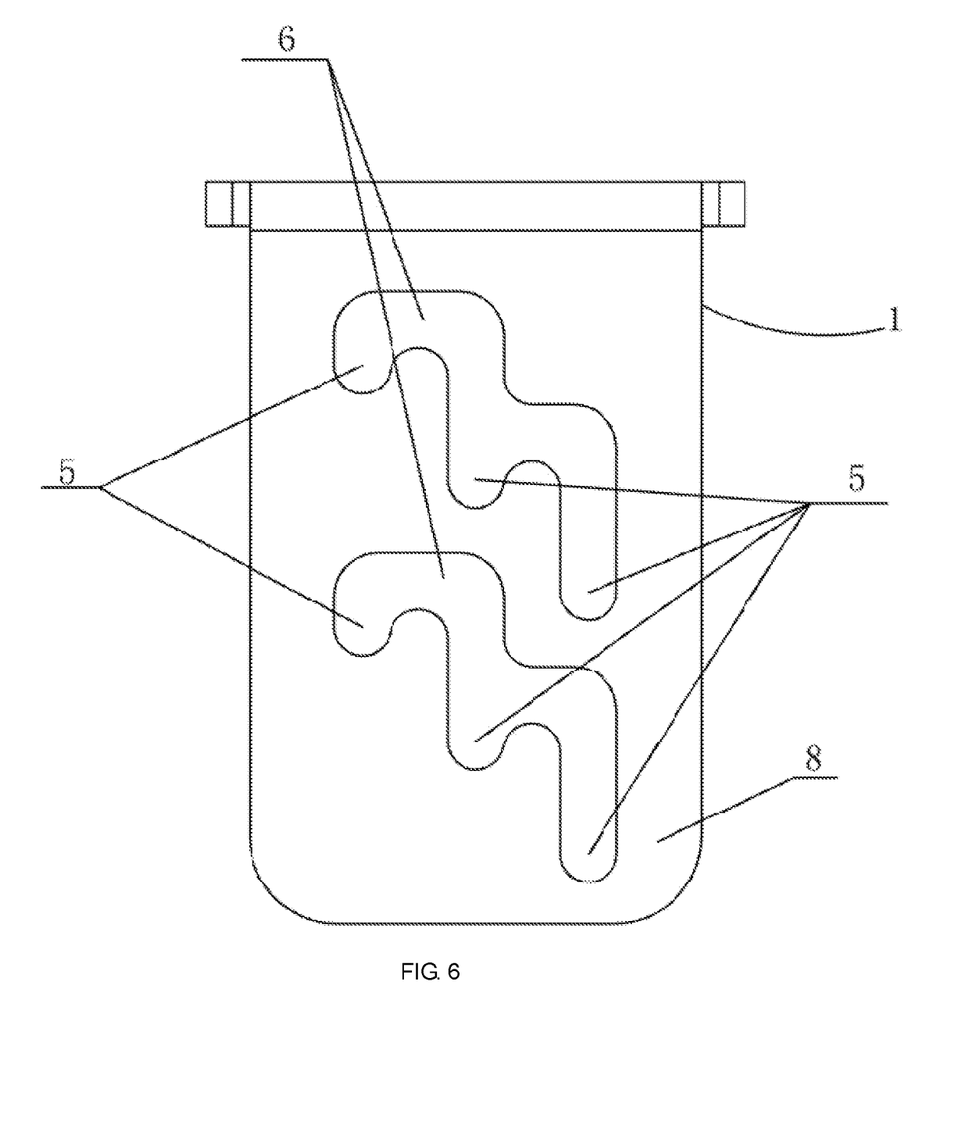
FIG. 6 illustrates the structures of a holder of a clamping device for a display stand according to a second embodiment of the present disclosure.
Figure 7:
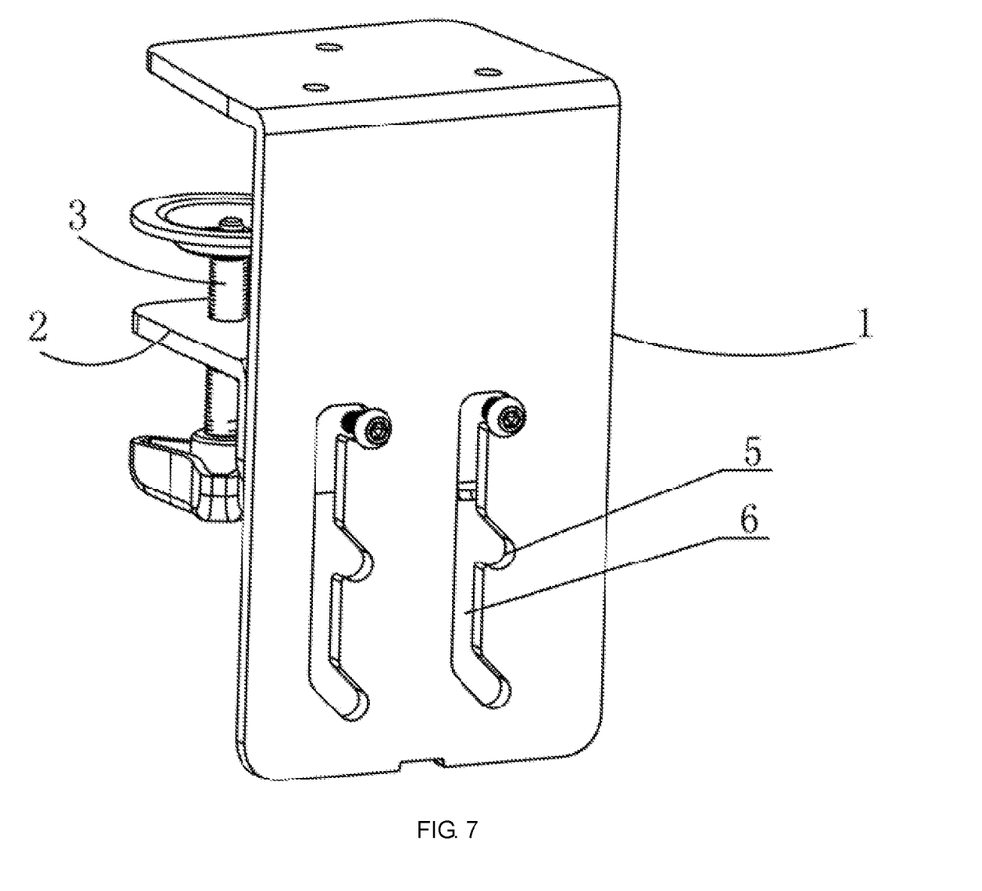
FIG. 7 illustrates the structures of a clamping device for a display stand according to a third embodiment of the present disclosure.
Figure 8:
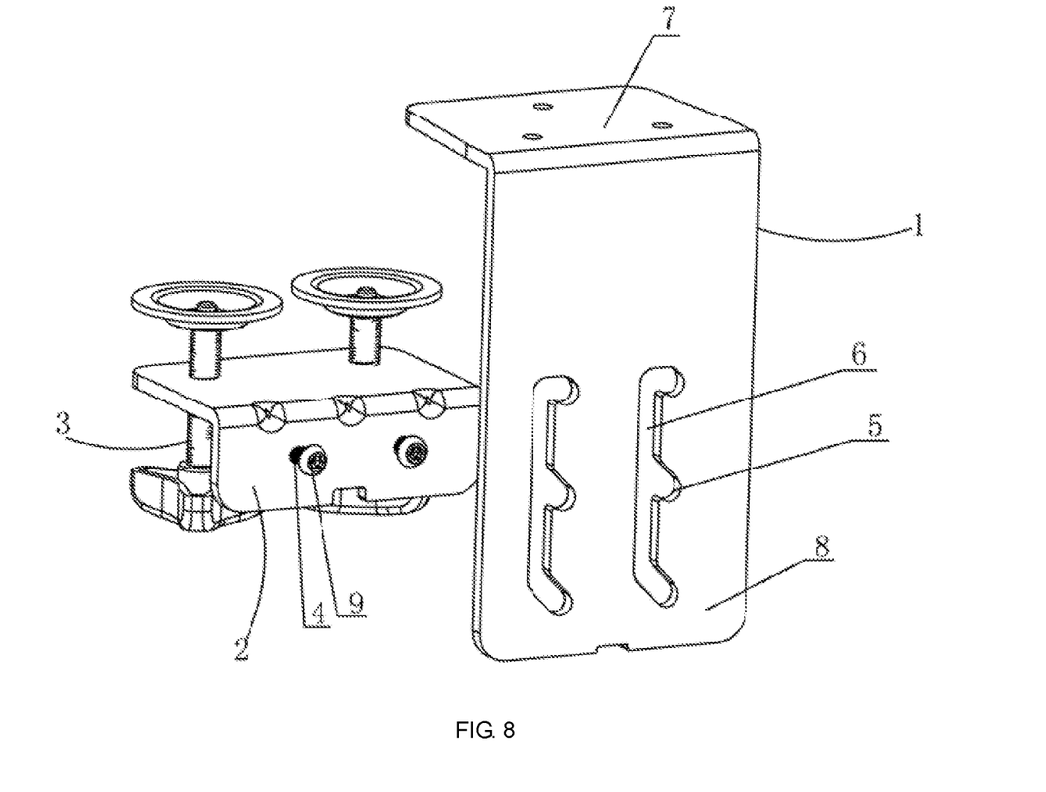
FIG. 8 illustrates the assembly of the structures of a clamping device for a display stand according to a third embodiment of the present disclosure.
Figure 9:
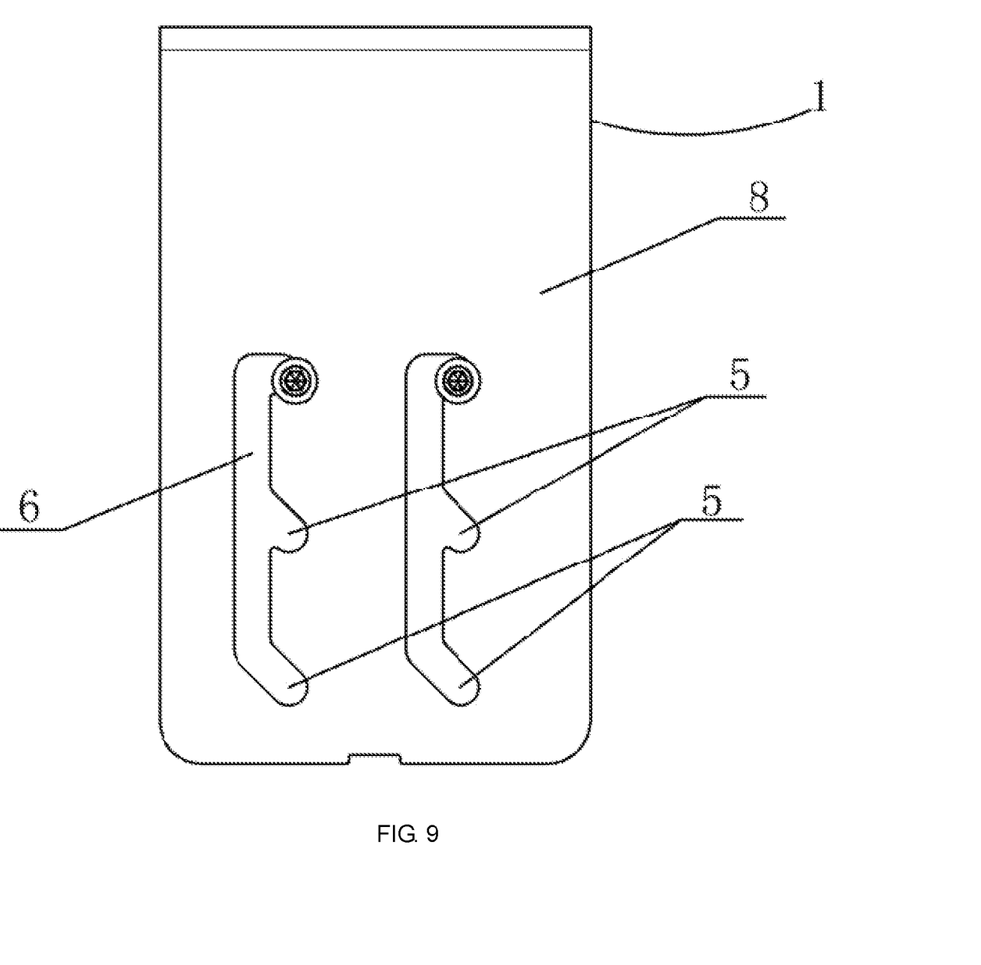
FIG. 9 illustrates the structures of a holder of a clamping device for a display stand according to a third embodiment of the present disclosure.
Figure 10:
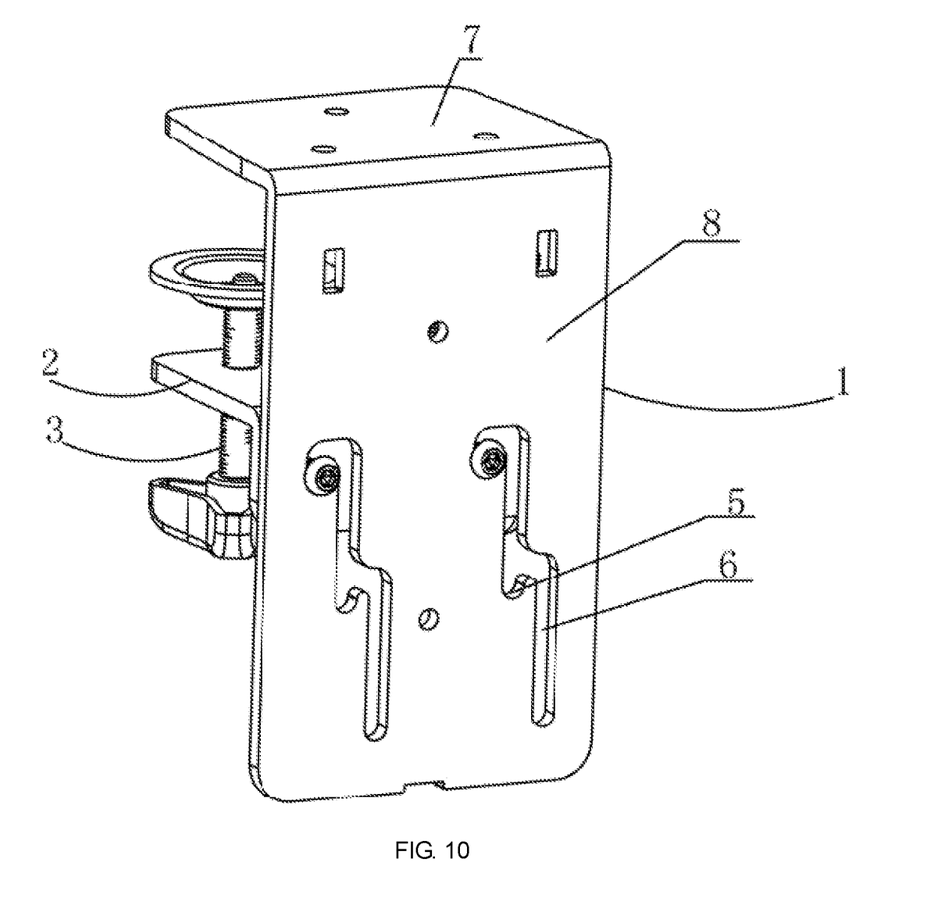
FIG. 10 illustrates the structures of a clamping device for a display stand according to a fourth embodiment of the present disclosure.
Figure 11:
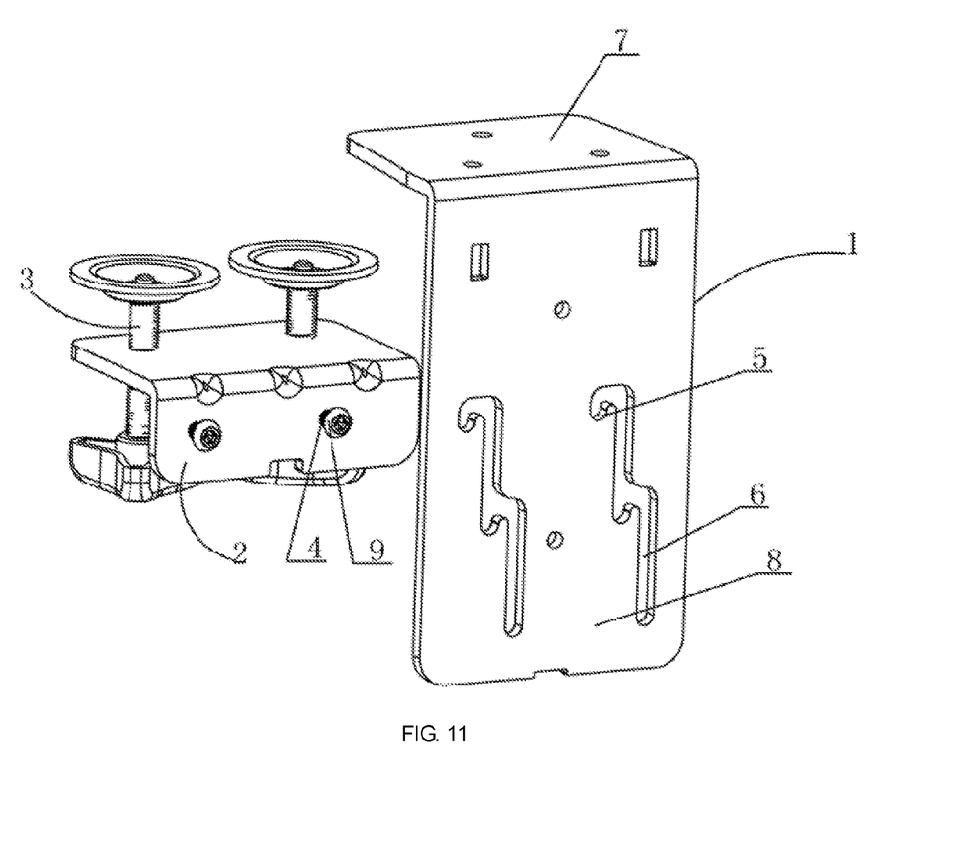
FIG. 11 illustrates the assembly of the structures of a clamping device for a display stand according to a fourth embodiment of the present disclosure.
Figure 12:
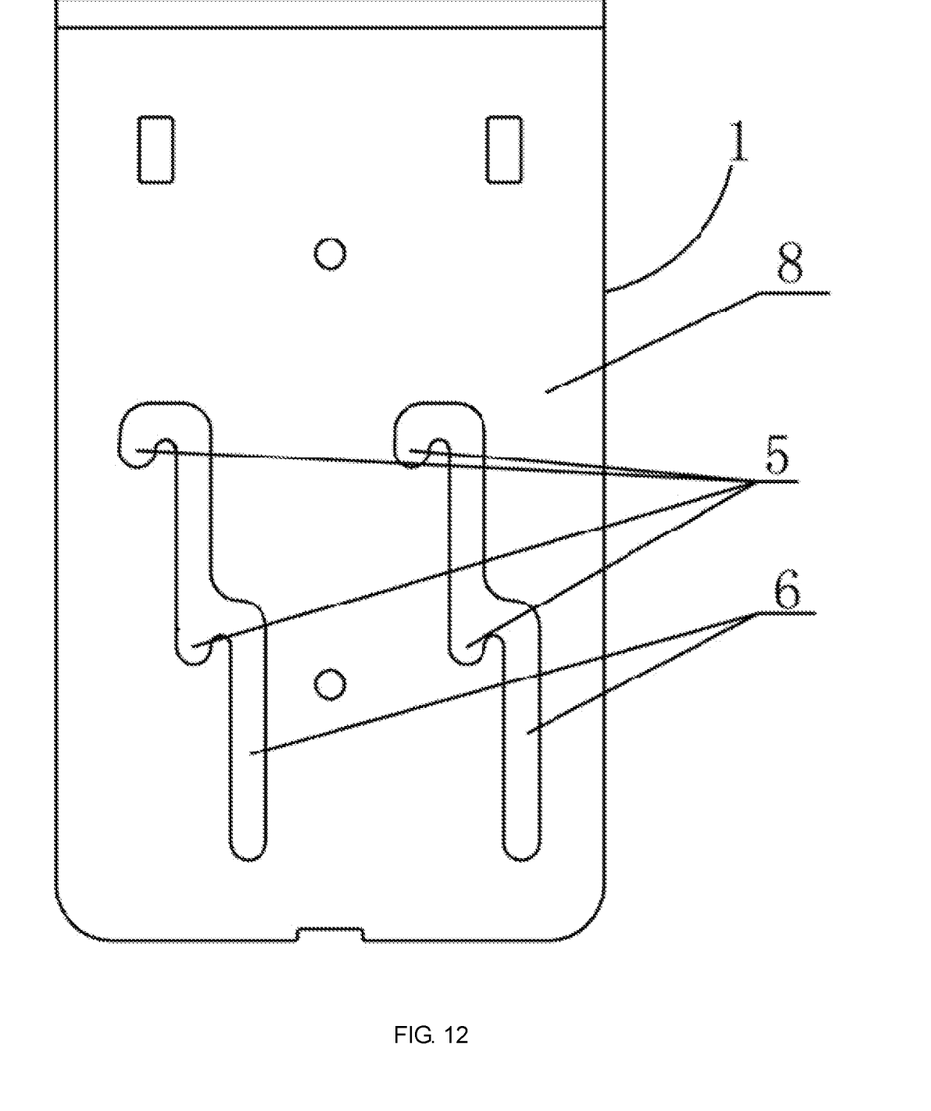
FIG. 12 illustrates the structures of a holder of a clamping device for a display stand according to a fourth embodiment of the present disclosure.

As shown in FIG. 4-6, a clamping device according to a second embodiment comprises a holder 1, a connector 2 and a fastening screw 3 screwed to the connector 2 to fasten to a table board. The holder 1 comprises an upper pressing board 7 and a side board 8. A gap is formed between the top of the fastening screw 3 and the bottom of the upper pressing board 7. The connector 2 is connected to the side board 8. At least one connecting column 4 is provided on the connector 2. A plurality of connecting holes 5 are provided on the side board 8 along a vertical direction to receive the at least one connecting column 4. The connecting column 4 connects the connector 2 to the side board 8 through the plurality of connecting holes 5. The connecting column 4 comprises a limiting cap 9 on an extruding end of the connecting column 4 to prevent falling of the connecting column 4 off the plurality of connecting holes 5. The side board 8 further comprises at least one channel 6 to connect at least two connecting holes 5 on different vertical positions of the side board 8. The at least one channel 6 is configured to move the connecting column 4 from a first connecting hole of the plurality of connecting holes 5 to the second connecting hole of the plurality of connecting holes 5 without separating from the side board 8. The connecting column 4 is a connecting pin or connecting screw with a limiting cap 9 on one end. For example, two connecting column 4 are connected to the connector 2. The two connecting column 4 are deployed on different vertical positions on the connector 2.

The side board 8 comprises two channels 6 which are parallel with each other and extend in the vertical direction of the side board 8. The plurality of connecting holes 5 comprise at least two pairs of connecting holes arranged on different positions along the vertical direction. The interval between the connecting holes 5 of each pair is constant. An upper connecting hole of each pair is connected to a bottom part of an upper channel of the two channels 6. A lower connecting hole of each pair is connected to a bottom part of a lower channel of the two channels 6. The two connecting columns 4 are in clearance fit within one pair of the at least two pairs of connecting holes 5.

As shown in FIG. 7-12, the connector 2 of a clamping device according to a third and a fourth embodiment comprises two protruding connecting columns arranged on the same vertical position along the connector. The side board 8 comprises two channels 6 which are parallel with each other and extend in the vertical direction of the side board 8. The plurality of connecting holes 5 comprise at least two pairs of connecting holes arranged along the channels 6. An interval between the connecting holes 5 of each pair is constant. The two connecting holes 5 of each pair are arranged on the same side of the channels 6. The two connecting holes 5 of each pair are connected to the two channels 6 respectively. The two connecting columns 4 are in clearance fit within one pair of connecting holes 5.

When adjusting the height of the connector relative to the side board of the holder with the clamping device for continuous adjustment of a display stand, the user would not need to disassemble the connector. The user would only need to slide the connecting column from one connecting hole to another connecting hole in a different vertical position through the channel to freely adjust the height of the connector. The clamping device as disclosed provides more convenient adjustment and requires mounting of the connecting column and the connector no more than once. Mounting the display stand can be performed more effectively since there is no more need to remove the connector and the connecting column when choosing a connecting hole for the connecting column on the connector.

We claim:

1. A clamping device for continuous adjustment of display stand, comprising:
    a holder having an upper pressing board and a side board;
    a connector connected to the side board, said connector having at least one connecting column; and
    a fastening screw screwed to the connector with a gap formed between the top of the fastening screw and the bottom of the upper pressing board, wherein
    the side board comprises a plurality of connecting holes along a vertical direction to receive the connecting column,
    the side board comprises at least one channel to connect a first connecting hole and a second connecting hole of the plurality of connecting holes which are located on two different positions along the vertical direction, of the side board,
    the connecting column connects the connector to the side board through the plurality of connecting holes,
    the connecting column comprises limiting cap on an extruding end of the connecting column to prevent falling of the connecting column off the plurality of connecting holes, and
    the at least one channel is configured to move the connecting column from the first connecting hole of the plurality of connecting holes to the second connecting hole of the plurality of connecting holes without separating from the side board.

2. The clamping device of claim 1, wherein the connecting column is one of a connecting pin and a connecting screw comprising the limiting cap on one of the two ends thereof.

3. The clamping device of claim 1, wherein the connector comprises two connecting columns arranged on two different vertical positions along the connector.

4. The clamping device of claim 3, wherein the side board comprises one channel which extends in the vertical direction of the side board, the plurality of connecting holes are arranged on the same side of the channel, an interval between any two adjacent connecting holes of the plurality of connecting holes along the vertical direction of the side board is constant, and the two connecting columns are in clearance fit within two adjacent connecting holes.

5. The clamping device of claim 3, wherein the side board comprises two channels which are parallel with each other and extend in the vertical direction of the side board, the plurality of connecting holes comprise at least two pairs of connecting holes arranged on different positions along the vertical direction, an interval between the connecting holes of each pair is constant, an upper connecting hole of each pair is connected to a bottom part of an upper channel of the two channels, a lower connecting hole of each pair is connected to a bottom part of a lower channel of the two channels and the two connecting columns are in clearance fit within one pair of the at least two pairs of connecting holes.

6. The clamping device of claim 1, wherein the connector comprises two protruding connecting columns arranged on the same vertical position along the connector.

7. The clamping device of claim 6, wherein the side board comprises two channels which are parallel with each other and extend in the vertical direction of the side board, the plurality of connecting holes comprise at least two pairs of connecting holes arranged along the channels, an interval between the connecting holes of each pair is constant, the two connecting holes of each pair are arranged on the same side of the channels, the two connecting holes of each pair are connected to the two channels respectively and the two connecting columns are in clearance fit within one pair of the at least two pairs of connecting holes.

* * * * *